US012701762B2

(12) United States Patent
Jewell et al.

(10) Patent No.: US 12,701,762 B2
(45) Date of Patent: Aug. 4, 2026

(54) CARBON-CONTAINING CAP LAYER FOR DOPED SEMICONDUCTOR EPITAXIAL LAYER

(71) Applicant: Applied Materials, Inc., Santa Clara, CA (US)

(72) Inventors: Jason Jewell, Santa Clara, CA (US); Abhishek Dube, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 658 days.

(21) Appl. No.: 17/975,377

(22) Filed: Oct. 27, 2022

(65) Prior Publication Data

US 2024/0145550 A1     May 2, 2024

(51) Int. Cl.
| | |
|---|---|
| *H10D 62/834* | (2025.01) |
| *C23C 16/24* | (2006.01) |
| *C23C 16/26* | (2006.01) |
| *C23C 16/52* | (2006.01) |
| *C23C 16/56* | (2006.01) |
| *C30B 25/16* | (2006.01) |
| *C30B 29/06* | (2006.01) |
| *C30B 29/68* | (2006.01) |
| *C30B 33/12* | (2006.01) |
| *H10P 14/20* | (2026.01) |
| *H10P 14/24* | (2026.01) |

(52) U.S. Cl.
CPC ........... *H10D 62/834* (2025.01); *C23C 16/24* (2013.01); *C23C 16/26* (2013.01); *C23C 16/52* (2013.01); *C23C 16/56* (2013.01); *C30B 25/16* (2013.01); *C30B 29/06* (2013.01); *C30B 29/68*

(2013.01); *C30B 33/12* (2013.01); *H10P 14/24* (2026.01); *H10P 14/3411* (2026.01); *H10P 14/3442* (2026.01)

(58) Field of Classification Search
CPC ......... H01L 21/0257–02584; H01L 21/02532; H01L 21/0245; H01L 21/02447; H01L 21/02529; H10D 62/834; C23C 16/26
See application file for complete search history.

(56) References Cited

U.S. PATENT DOCUMENTS

| | | | |
|---|---|---|---|
| 8,026,539 | B2 | 9/2011 | Hargrove et al. |
| 8,367,528 | B2 | 2/2013 | Bauer et al. |

(Continued)

FOREIGN PATENT DOCUMENTS

| | | | | | |
|---|---|---|---|---|---|
| DE | 102021100965 A1 | * | 2/2022 | ......... | H10D 30/6757 |
| KR | 20140112358 A | | 9/2014 | | |

(Continued)

OTHER PUBLICATIONS

International Search Report and Written Opinion dated Nov. 1, 2023 for Application No. PCT/US2023/027487.

(Continued)

*Primary Examiner* — Christine S. Kim
*Assistant Examiner* — Andrew Victor Prostor
(74) *Attorney, Agent, or Firm* — Patterson + Sheridan, LLP

(57) ABSTRACT

A semiconductor structure includes a stack of alternating doped semiconductor epitaxial layers and cap epitaxial layers formed on a substrate. Each doped semiconductor epitaxial layer includes silicon having carrier dopants, and each cap epitaxial layer includes silicon and carbon undoped with carrier dopants.

16 Claims, 6 Drawing Sheets

(56)     References Cited

U.S. PATENT DOCUMENTS

| | | | |
|---|---|---|---|
| 8,809,170 | B2 | 8/2014 | Bauer |
| 10,249,739 | B2 | 4/2019 | Guillorn et al. |
| 11,101,359 | B2 | 8/2021 | Wu et al. |
| 2015/0069327 | A1* | 3/2015 | Cheng ............... H01L 21/02529 |
| | | | 257/19 |
| 2019/0221483 | A1* | 7/2019 | Mulfinger ............ H10D 62/116 |
| 2021/0118679 | A1* | 4/2021 | Barbosa Lima .. H01L 21/02452 |
| 2022/0181259 | A1 | 6/2022 | Chiang et al. |

FOREIGN PATENT DOCUMENTS

| | | |
|---|---|---|
| KR | 20150132465 A | 11/2015 |
| KR | 20220021850 A | 2/2022 |

OTHER PUBLICATIONS

Korean Office Action Dated Jan. 13, 2026 for Application 10-2025-7017301.

* cited by examiner

400

300

300

300

300

CARBON-CONTAINING CAP LAYER FOR DOPED SEMICONDUCTOR EPITAXIAL LAYER

BACKGROUND

Field

Embodiments described herein generally relate to semiconductor device fabrication, and more particularly, to systems and methods of forming a doped semiconductor layer and a cap layer within a semiconductor structure.

Description of the Related Art

Phosphorus-doped selective epitaxial technology has gained interest as a method to reduce external transistor resistance in source/drain of n-type metal-oxide semiconductor (MOS) devices. High phosphorous doping is required to ensure low contact resistance when metal contacts are formed. However, phosphorous dopants of high concentration tend to diffuse, preventing control of doping profile in the phosphorus-doped epitaxial layer.

Therefore, there is a need for methods and systems that can epitaxially form a doped semiconductor layer that can prevent diffusion of dopants therewithin.

SUMMARY

Embodiments of the present disclosure provide a semiconductor structure. The semiconductor structure includes a stack of alternating doped semiconductor epitaxial layers and cap epitaxial layers formed on a substrate. Each doped semiconductor epitaxial layer includes silicon having carrier dopants, and each cap epitaxial layer includes silicon and carbon un-doped with carrier dopants.

Embodiments of the present disclosure also provide a method of forming a doped semiconductor layer in a semiconductor structure. The method includes performing a plurality of cycles of a first deposition process, a second deposition process subsequent to the first deposition process, and an etch process. The first deposition process forms a doped semiconductor layer on an exposed surface of a substrate. The second deposition process forms an un-doped cap layer on the doped semiconductor layer. The etch process selectively removes an amorphous portion of the un-doped cap layer and an amorphous portion of the doped semiconductor layer, and leaves an epitaxial portion of the un-doped cap layer and an epitaxial portion of the doped semiconductor layer. The doped semiconductor layer includes silicon having carrier dopants, and the un-doped cap layer includes carbon.

Embodiments of the present disclosure further provide a processing system. The processing system includes a processing chamber, and a system controller configured to cause the processing system to perform a plurality of cycles of a first deposition process, a second deposition process subsequent to the first deposition process, and an etch process. The first deposition process forms a doped semiconductor layer on an exposed surface of a substrate. The second deposition process forms an un-doped cap layer on the doped semiconductor layer. The etch process selectively removing an amorphous portion of the un-doped cap layer and an amorphous portion of the doped semiconductor layer, and leaving an epitaxial portion of the un-doped cap layer and an epitaxial portion of the doped semiconductor layer.

The doped semiconductor layer includes silicon having carrier dopants, and the un-doped cap layer includes carbon.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The embodiments described herein provide methods and systems for forming a doped semiconductor epitaxial layer in which diffusion of dopants are prevented by an adjacent cap epitaxial layer. The doped semiconductor epitaxial layer includes silicon and carrier dopants of high concentration. The cap epitaxial layer includes silicon and carbon and is not doped with carrier dopants. Multiple pairs of the doped semiconductor epitaxial layer and the cap epitaxial layers that are interposed within the doped semiconductor epitaxial layers are formed and can be used as source/drain in an n-type metal-oxide semiconductor (NMOS) device. Due to the prevention of diffusion of dopants, a sharper doping profile can be achieved. Further, due to tensile strain induced in the cap epitaxial layer, an electron mobility can be enhanced, thus leading to high conductivity in its device application.

The methods include cyclic deposition and etch process, which allows selective epitaxial growth of the doped semiconductor layers and the cap layers.

Figure 1:
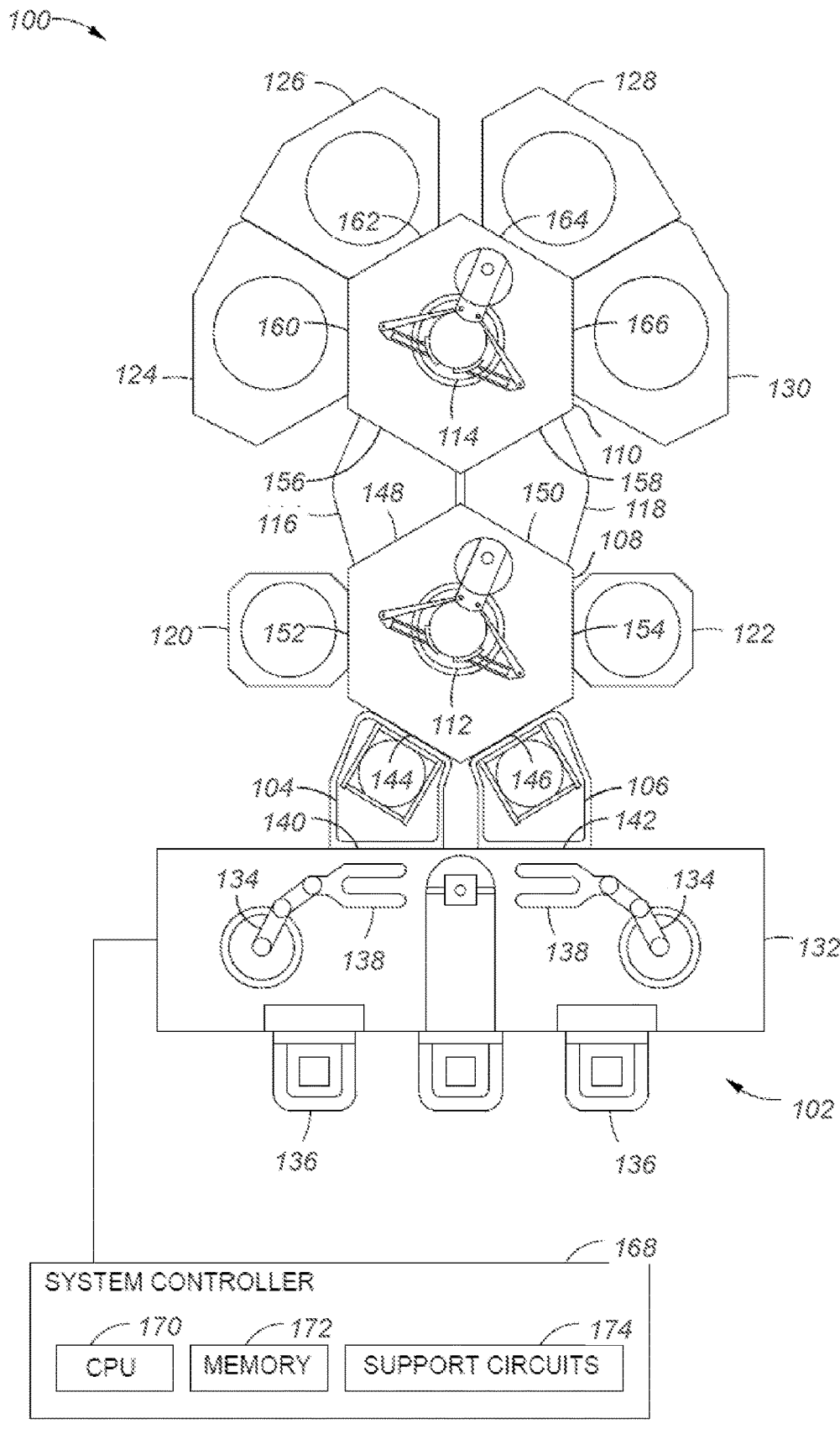
FIG. 1 is a schematic top view of a multi-chamber processing system according to one or more embodiments of the present disclosure.

FIG. 1 is a schematic top view of a multi-chamber processing system 100, according to one or more embodiments of the present disclosure. The processing system 100 generally includes a factory interface 102, load lock chambers 104, 106, transfer chambers 108, 110 with respective transfer robots 112, 114, holding chambers 116, 118, and processing chambers 120, 122, 124, 126, 128, 130. As detailed herein, substrates in the processing system 100 can be processed in and transferred between the various chambers without exposing the substrates to an ambient environment exterior to the processing system 100 (e.g., an atmospheric ambient environment such as may be present in a fab). For example, the substrates can be processed in and transferred between the various chambers maintained at a low pressure (e.g., less than or equal to about 300 Torr) or vacuum environment without breaking the low pressure or vacuum environment among various processes performed on the substrates in the processing system 100. Accordingly, the processing system 100 may provide for an integrated solution for some processing of substrates.

Examples of a processing system that may be suitably modified in accordance with the teachings provided herein include the Endura®, Producer® or Centura® integrated processing systems or other suitable processing systems commercially available from Applied Materials, Inc., located in Santa Clara, California. It is contemplated that other processing systems (including those from other manufacturers) may be adapted to benefit from aspects described herein.

In the illustrated example of FIG. 1, the factory interface 102 includes a docking station 132 and factory interface robots 134 to facilitate transfer of substrates. The docking station 132 is adapted to accept one or more front opening unified pods (FOUPs) 136. In some examples, each factory interface robot 134 generally includes a blade 138 disposed on one end of the respective factory interface robot 134 adapted to transfer the substrates from the factory interface 102 to the load lock chambers 104, 106.

The load lock chambers 104, 106 have respective ports 140, 142 coupled to the factory interface 102 and respective ports 144, 146 coupled to the transfer chamber 108. The transfer chamber 108 further has respective ports 148, 150 coupled to the holding chambers 116, 118 and respective ports 152, 154 coupled to processing chambers 120, 122. Similarly, the transfer chamber 110 has respective ports 156, 158 coupled to the holding chambers 116, 118 and respective ports 160, 162, 164, 166 coupled to processing chambers 124, 126, 128, 130. The ports 144, 146, 148, 150, 152, 154, 156, 158, 160, 162, 164, 166 can be, for example, slit valve openings with slit valves for passing substrates therethrough by the transfer robots 112, 114 and for providing a seal between respective chambers to prevent a gas from passing between the respective chambers. Generally, any port is open for transferring a substrate therethrough. Otherwise, the port is closed.

The load lock chambers 104, 106, transfer chambers 108, 110, holding chambers 116, 118, and processing chambers 120, 122, 124, 126, 128, 130 may be fluidly coupled to a gas and pressure control system (not specifically illustrated). The gas and pressure control system can include one or more gas pumps (e.g., turbo pumps, cryo-pumps, roughing pumps), gas sources, various valves, and conduits fluidly coupled to the various chambers. In operation, a factory interface robot 134 transfers a substrate from a FOUP 136 through a port 140 or 142 to a load lock chamber 104 or 106. The gas and pressure control system then pumps down the load lock chamber 104 or 106. The gas and pressure control system further maintains the transfer chambers 108, 110 and holding chambers 116, 118 with an interior low pressure or vacuum environment (which may include an inert gas). Hence, the pumping down of the load lock chamber 104 or 106 facilitates passing the substrate between, for example, the atmospheric environment of the factory interface 102 and the low pressure or vacuum environment of the transfer chamber 108.

With the substrate in the load lock chamber 104 or 106 that has been pumped down, the transfer robot 112 transfers the substrate from the load lock chamber 104 or 106 into the transfer chamber 108 through the port 144 or 146. The transfer robot 112 is then capable of transferring the substrate to and/or between any of the processing chambers 120, 122 through the respective ports 152, 154 for processing and the holding chambers 116, 118 through the respective ports 148, 150 for holding to await further transfer. Similarly, the transfer robot 114 is capable of accessing the substrate in the holding chamber 116 or 118 through the port 156 or 158 and is capable of transferring the substrate to and/or between any of the processing chambers 124, 126, 128, 130 through the respective ports 160, 162, 164, 166 for processing and the holding chambers 116, 118 through the respective ports 156, 158 for holding to await further transfer. The transfer and holding of the substrate within and among the various chambers can be in the low pressure or vacuum environment provided by the gas and pressure control system.

The processing chambers 120, 122, 124, 126, 128, 130 can be any appropriate chamber for processing a substrate. In some examples, the processing chamber 120 can be capable of performing an etch process, the processing chamber 122 can be capable of performing a cleaning process, the processing chamber 124 can be capable of performing a selective removal process, and the processing chambers 126, 128, 130 can be capable of performing respective epitaxial growth processes. The processing chamber 120 may be a Selectra™ Etch chamber available from Applied Materials of Santa Clara, Calif. The processing chamber 122 may be a SiCoNi™ Pre-clean chamber available from Applied Materials of Santa Clara, Calif. The processing chamber 126, 128, or 130 may be a Centura™ Epi chamber available from Applied Materials of Santa Clara, Calif.

A system controller 168 is coupled to the processing system 100 for controlling the processing system 100 or components thereof. For example, the system controller 168 may control the operation of the processing system 100 using a direct control of the chambers 104, 106, 108, 110, 116, 118, 120, 122, 124, 126, 128, 130 of the processing system 100 or by controlling controllers associated with the chambers 104, 106, 108, 110, 116, 118, 120, 122, 124, 126, 128, 130. In operation, the system controller 168 enables data collection and feedback from the respective chambers to coordinate performance of the processing system 100.

The system controller 168 generally includes a central processing unit (CPU) 170, memory 172, and support circuits 174. The CPU 170 may be one of any form of a general purpose processor that can be used in an industrial setting. The memory 172, or non-transitory computer-readable medium, is accessible by the CPU 170 and may be one or more of memory such as random access memory (RAM), read only memory (ROM), floppy disk, hard disk, or any other form of digital storage, local or remote. The support circuits 174 are coupled to the CPU 170 and may comprise cache, clock circuits, input/output subsystems, power supplies, and the like. The various methods disclosed herein may generally be implemented under the control of the CPU 170 by the CPU 170 executing computer instruction code stored in the memory 172 (or in memory of a particular processing chamber) as, for example, a software routine. When the computer instruction code is executed by the CPU 170, the CPU 170 controls the chambers to perform processes in accordance with the various methods.

Other processing systems can be in other configurations. For example, more or fewer processing chambers may be coupled to a transfer apparatus. In the illustrated example, the transfer apparatus includes the transfer chambers 108, 110 and the holding chambers 116, 118. In other examples, more or fewer transfer chambers (e.g., one transfer chamber)

and/or more or fewer holding chambers (e.g., no holding chambers) may be implemented as a transfer apparatus in a processing system.

Figure 2:
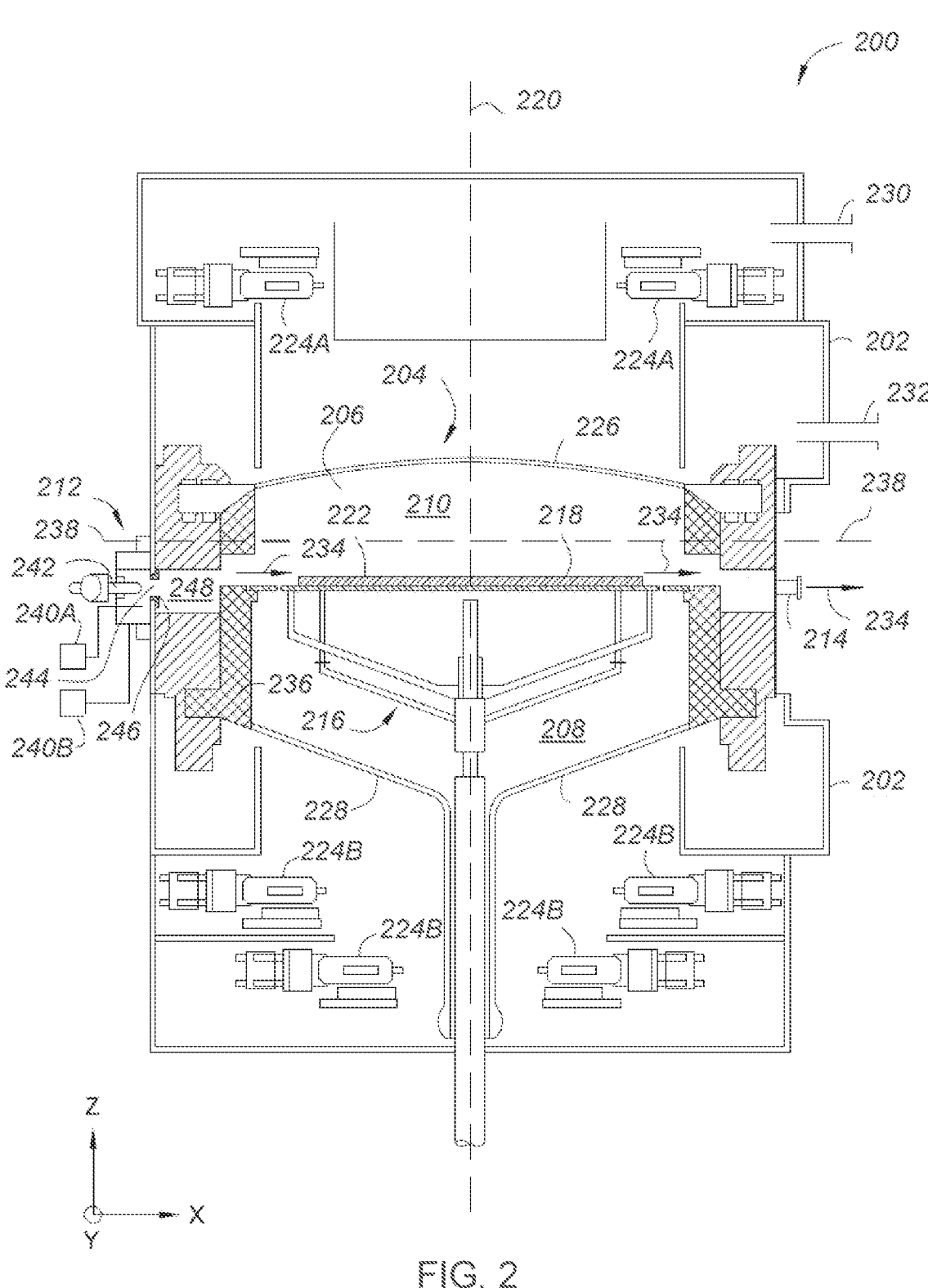
FIG. 2 is a cross sectional view of a processing chamber, according to one or more embodiments.

FIG. 2 is a cross sectional view of a processing chamber 200, according to one or more embodiments, that is adapted to perform an epitaxial (Epi) deposition process as detailed below. The processing chamber 200 may be the processing chamber 126, 128, or 130 shown in FIG. 1.

The processing chamber 200 includes a housing structure 202 made of a process resistant material, such as aluminum or stainless steel, for example 216L stainless steel. The housing structure 202 encloses various functioning elements of the processing chamber 200, such as a quartz chamber 204, which includes an upper quartz chamber 206, and a lower quartz chamber 208, in which a processing volume 210 is contained. Reactive species are provided to the quartz chamber 204 by a gas distribution assembly 212, and processing byproducts are removed from the processing volume 210 by an outlet port 214, which is typically in communication with a vacuum source (not shown).

A substrate support 216 is adapted to receive a substrate 218 that is transferred to the processing volume 210. The substrate support 216 is disposed along a longitudinal axis 220 of the processing chamber 200. The substrate support 216 may be made of a ceramic material or a graphite material coated with a silicon material, such as silicon carbide, or other process resistant material. Reactive species from precursor reactant materials are applied to a surface 222 of the substrate 218, and byproducts may be subsequently removed from the surface 222 of the substrate 218. Heating of the substrate 218 and/or the processing volume 210 may be provided by radiation sources, such as upper lamp modules 224A and lower lamp modules 224B.

In one embodiment, the upper lamp modules 224A and the lower lamp modules 224B are infrared (IR) lamps. Non-thermal energy or radiation from the lamp modules 224A and 224B travels through an upper quartz window 226 of the upper quartz chamber 206, and through a lower quartz window 228 of the lower quartz chamber 208. Cooling gases for the upper quartz chamber 206, if needed, enter through an inlet 230 and exit through an outlet 232. Precursor reactant materials, as well as diluent, purge and vent gases for the processing chamber 200, enter through the gas distribution assembly 212 and exit through the outlet port 214. While the upper quartz window 226 is shown as being curved or convex, the upper quartz window 226 may be planar or concave as the pressure on both sides of the upper quartz window 226 is substantially the same (i.e., atmospheric pressure).

The low wavelength radiation in the processing volume 210, which is used to energize reactive species and assist in adsorption of reactants and desorption of process byproducts from the surface 222 of the substrate 218, typically ranges from about 0.8 μm to about 1.2 μm, for example, between about 0.95 μm to about 1.05 μm, with combinations of various wavelengths being provided, depending, for example, on the composition of the film which is being epitaxially grown.

The component gases enter the processing volume 210 via the gas distribution assembly 212. Gas flows from the gas distribution assembly 212 and exits through the outlet port 214 as shown generally by a flow path 234. Combinations of component gases, which are used to clean/passivate a substrate surface, or to form the silicon and/or germanium-containing film that is being epitaxially grown, are typically mixed prior to entry into the processing volume 210. The overall pressure in the processing volume 210 may be adjusted by a valve (not shown) on the outlet port 214. At least a portion of the interior surface of the processing volume 210 is covered by a liner 236. In one embodiment, the liner 236 comprises a quartz material that is opaque. In this manner, the chamber wall is insulated from the heat in the processing volume 210.

The temperature of surfaces in the processing volume 210 may be controlled within a temperature range of about 200° C. to about 600° C., or greater, by the flow of a cooling gas, which enters through the inlet 230 and exits through the outlet 232, in combination with radiation from the upper lamp modules 224A positioned above the upper quartz window 226. The temperature in the lower quartz chamber 208 may be controlled within a temperature range of about 200° C. to about 600° C. or greater, by adjusting the speed of a blower unit which is not shown, and by radiation from the lower lamp modules 224B disposed below the lower quartz chamber 208. The pressure in the processing volume 210 may be between about 0.1 Torr to about 600 Torr, such as between about 5 Torr to about 30 Torr.

The temperature on the surface 222 of the substrate 218 may be controlled by power adjustment to the lower lamp modules 224B in the lower quartz chamber 208, or by power adjustment to both the upper lamp modules 224A overlying the upper quartz window 226, and the lower lamp modules 224B in the lower quartz chamber 208. The power density in the processing volume 210 may be between about 40 W/cm$^2$ to about 400 W/cm$^2$, such as about 80 W/cm$^2$ to about 120 W/cm$^2$.

In one aspect, the gas distribution assembly 212 is disposed normal to, or in a radial direction 238 relative to, the longitudinal axis 220 of the processing chamber 200 or the substrate 218. In this orientation, the gas distribution assembly 212 is adapted to flow process gases in the radial direction 238 across, or parallel to, the surface 222 of the substrate 218. In one processing application, the process gases are preheated at the point of introduction to the processing chamber 200 to initiate preheating of the gases prior to introduction to the processing volume 210, and/or to break specific bonds in the gases. In this manner, surface reaction kinetics may be modified independently from the thermal temperature of the substrate 218.

In operation, precursors used to form silicon (Si) and silicon germanium (SiGe) blanket or selective epitaxial films are provided to the gas distribution assembly 212 from one or more gas sources 240A and 240B. IR lamps 242 (only one is shown in FIG. 2) may be utilized to heat the precursors within the gas distribution assembly 212 as well as along the flow path 234. The gas sources 240A, 240B may be coupled the gas distribution assembly 212 in a manner adapted to facilitate introduction zones within the gas distribution assembly 212, such as a radial outer zone and a radial inner zone between the outer zones when viewed in from a top plan view. The gas sources 240A, 240B may include valves (not shown) to control the rate of introduction into the zones.

The gas sources 240A, 240B may include silicon precursors such as silanes, including silane (SiH$_4$), disilane (Si$_2$H$_6$), dichlorosilane (SiH$_2$Cl$_2$), hexachlorodisilane (Si$_2$Cl$_6$), dibromosilane (SiH$_2$Br$_2$), higher order silanes, derivatives thereof, and combinations thereof. The gas sources 240A, 240B may also include germanium containing precursors, such as germane (GeH$_4$), digermane (Ge$_2$H$_6$), germanium tetrachloride (GeCl$_4$), dichlorogermane (GeH$_2$Cl$_2$), derivatives thereof, and combinations thereof. The silicon and/or germanium containing precursors may be used in combination with hydrogen chloride (HCl), chlorine gas (Cl$_2$), hydrogen bromide (HBr), and combinations thereof. The gas sources 240A, 240B may include one or more of the silicon and germanium containing precursors in one or both of the gas sources 340A, 340B.

The precursor materials enter the processing volume 210 through openings or holes 244 (only one is shown in FIG. 2) in the perforated plate 246 in this excited state, which in one embodiment is a quartz material, having the holes 244 formed therethrough. The perforated plate 246 is transparent to IR energy, and may be made of a clear quartz material. In other embodiments, the perforated plate 246 may be any material that is transparent to IR energy and is resistant to process chemistry and other processing chemistries. The energized precursor materials flow toward the processing volume 210 through the holes 244 in the perforated plate 246, and through channels 248 (only one is shown in FIG. 2). A portion of the photons and non-thermal energy from the IR lamps 242 also passes through the holes 244, the perforated plate 246, and channels 248 facilitated by a reflective material and/or surface disposed on the interior surfaces of the gas distribution assembly 212, thereby illuminating the flow path 234 of the precursor materials. In this manner, the vibrational energy of the precursor materials may be maintained from the point of introduction to the processing volume 210 along the flow path.

Figure 3:
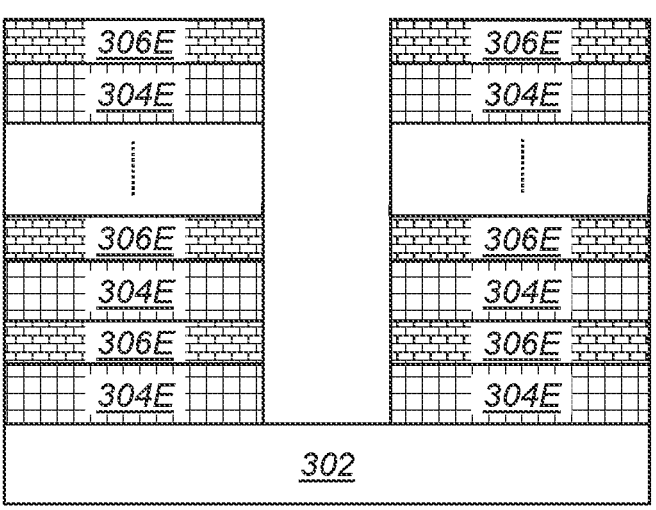
FIG. 3 is a cross-sectional view of a semiconductor structure that includes a doped semiconductor layer and a cap layer, according to one or more embodiments.

FIG. 3 is a cross-sectional view of a semiconductor structure 300 that includes a doped semiconductor layer and a cap layer, according to one or more embodiments of the present disclosure. A doped semiconductor layer, doped with n-type carrier dopants, such as phosphorous, may be used as a source/drain in negative metal-oxide semiconductor (NMOS) devices.

The semiconductor structure 300 includes a substrate 302, and a stack of alternating doped semiconductor epitaxial layers 304E and cap epitaxial layers 306E interposed between the doped semiconductor epitaxial layers 304E, formed on the substrate 302.

The term "substrate" as used herein refers to a layer of material that serves as a basis for subsequent processing operations and includes a surface to be cleaned. The substrate may be a silicon based material or any suitable insulating materials or conductive materials as needed. The substrate may include a material such as crystalline silicon (e.g., Si<100> or Si<111>), silicon oxide, strained silicon, silicon germanium, doped or undoped polysilicon, doped or undoped silicon wafers and patterned or non-patterned wafers, silicon on insulator (SOI), carbon doped silicon oxides, silicon nitride, doped silicon, germanium, gallium arsenide, glass, or sapphire.

The doped semiconductor epitaxial layers 304E are formed of silicon (Si) or silicon germanium (SiGe) with a ratio of germanium (Ge) ranging between 20% and 100%. The doped semiconductor epitaxial layers 304E may be doped with n-type carrier dopants such as phosphorus (P) or antimony (Sb) with the concentration between about $10^{19}$ $cm^{-3}$ and $5 \cdot \times 10^{21}$ $cm^{-3}$, depending upon the desired conductive characteristic of the semiconductor structure 300. The doped semiconductor epitaxial layer 304E may be doped with p-type carrier dopants such as boron (B), gallium (Ga), aluminum (Al), or indium (In) with the concentration of between about $10^{20}$ $cm^{-3}$ and $5 \times 10^{21}$ $cm^{-3}$, depending upon the desired conductive characteristic of the semiconductor structure 300.

The cap epitaxial layers 306E may be formed of un-doped carbon (C), carbon-doped silicon (Si:C), or carbon-doped silicon germenium (SiGe:C). The cap epitaxial layers 306E may not be doped with carrier dopants. In the cap epitaxial layers 306E, strain is induced by substitutional doping of carbon atoms in place for silicon or germanium atoms in the crystalline structure. For example, substituting silicon (Si) atoms with carbon (C) induces a tensile strain due to differences in the lattice constants of silicon (Si) (e.g., 5.431 Å for crystalline silicon (Si)) and carbon (C) (e.g., 3.567 Å for diamond carbon), and of germanium (Ge) and carbon (C). Substituting germanium (Ge) atoms with carbon (C) also induces a tensile strain due to differences in the lattice constants of germanium (Ge) (e.g., 5.65 Å for crystalline germanium (Ge)) and carbon (C). The strain-induced cap epitaxial layers 306 prevents migration of carrier dopants (e.g., phosphorous (P)) out of adjacent doped semiconductor epitaxial layers 304E, thus providing a sharp doping profile. Further, the strain-induced cap epitaxial layers 306 enhances electron mobility, thus leading to higher conductivity in their potential device applications.

The doped semiconductor epitaxial layers 304E may each have a thickness of between about 15 Å and about 20 Å. The cap epitaxial layers 306E may each have a thickness of between about 5 Å and about 15 Å. The semiconductor structure 300 may have about 30 pairs of the doped semiconductor epitaxial layers 304E and the cap epitaxial layers 306E, having a total thickness of between about 500 Å and about 700 Å, for example, about 600 Å.

Figure 4:
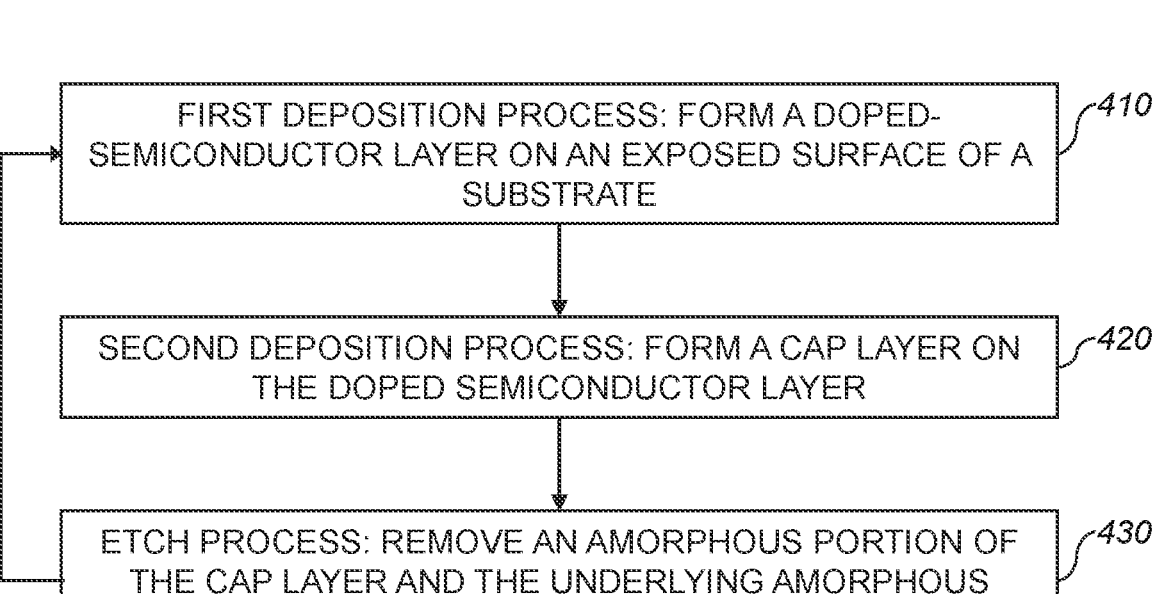
FIG. 4 depicts a process flow diagram of a method of forming a contact layer in a semiconductor structure according to one or more embodiments of the present disclosure.

FIG. 4 depicts a process flow diagram of a method 400 of forming a doped semiconductor layer in a semiconductor structure 300 according to one or more embodiments of the present disclosure. FIGS. 5A, 5B, 5C, 5D, 5E, and 5F are cross-sectional views of a portion of the semiconductor structure 300 corresponding to various states of the method 400. It should be understood that FIGS. 5A, 5B, 5C, 5D, 5E, and 5F illustrate only partial schematic views of the semiconductor structure 300, and the semiconductor structure 300 may contain any number of transistor sections, dielectric layers, and additional materials not illustrated in the figures. It should also be noted that although the method illustrated in FIG. 4 is described sequentially, other process sequences that include one or more operations that have been omitted and/or added, and/or has been rearranged in another desirable order, fall within the scope of the embodiments of the disclosure provided herein.

Figure 5A:
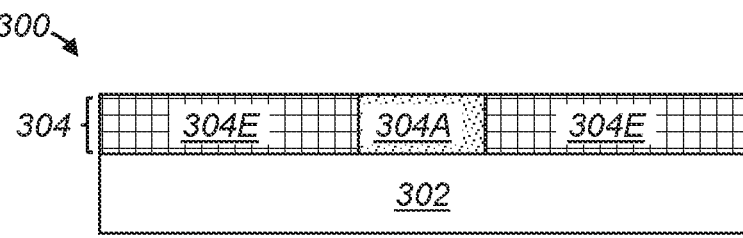
FIGS. 5A, 5B, 5C, 5D, 5E, and 5F are cross-sectional views of a portion of a semiconductor structure corresponding to various states of the method of FIG. 4.

The method 400 begins with block 410, in which a first deposition process is performed to form a doped semiconductor layer 304 on an exposed surface of the substrate 302, as shown in FIG. 5A. The first deposition process may include any suitable deposition technique, such as epitaxial (Epi) deposition, chemical vapor deposition (CVD), atomic layer deposition (ALD), or physical vapor deposition (PVD), by flowing a deposition gas in a processing chamber, such as the processing chamber 126, 128, or 130 shown in FIG. 1, or the processing chamber 200 shown in FIG. 2.

The doped semiconductor layer 304 is formed of silicon (Si) or silicon germanium (SiGe) with a ratio of germanium (Ge) ranging between 20% and 100%. The doped semiconductor layer 304 may be doped with n-type carrier dopants such as phosphorus (P) or antimony (Sb) with the concentration between about $10^{19}$ $cm^{-3}$ and $5 \cdot \times 10^{21}$ $cm^{-3}$, depending upon the desired conductive characteristic of the semiconductor structure 300. The doped semiconductor layer 304 may be doped with p-type carrier dopants such as boron (B), gallium (Ga), aluminum (Al), or indium (In) with the concentration of between about $10^{20}$ $cm^{-3}$ and $5 \times 10^{21}$ $cm^{-3}$, depending upon the desired conductive characteristic of the semiconductor structure 300.

In some embodiments, the deposition gas used in the first deposition process includes a silicon-containing precursor, a germanium containing precursor, and a dopant source. The silicon-containing precursor may include silane (SiH$_4$), disilane (Si$_2$H$_6$), tetrasilane (Si$_4$H$_{10}$), or a combination thereof. The germanium-containing precursor may include germane (GeH$_4$), germanium tetrachloride (GeCl$_4$), and digermane (Ge$_2$H$_6$). The n-type dopant source may include phosphine (PH$_3$), phosphorus trichloride (PCl$_3$), triisobutylphosphine ([(CH$_3$)$_3$C]$_3$P), antimony trichloride (SbCl$_3$), Sb(C$_2$H$_5$)$_5$, arsine (AsH$_3$), arsenic trichloride (AsCl$_3$), or tertiarybutylarsine (AsC$_4$H$_{11}$). The p-type dopant source may include diborane (B$_2$H$_6$), or boron trichloride (BCl$_3$).

In the first deposition process in block 410, the doped semiconductor layer 304, as deposited, may include an epitaxial portion 304E and an amorphous portion 304A, due to, for example, different nucleation rates of the doped semiconductor layer 304 on a surface of a semiconductor region (e.g., silicon (Si) or silicon germanium (SiGe)) of the substrate 302 and on a surface of a dielectric region (e.g., silicon dioxide (SiO$_2$) or silicon nitride (Si$_3$N$_4$)) of the substrate 302. The nucleation may occur at a faster rate on the surface of the semiconductor region than on the surface of the dielectric region, and thus an epitaxial portion 304E of the doped semiconductor layer 304 may be formed selectively on the surface of the semiconductor region while an amorphous portion 304A of the doped semiconductor layer 304 may be formed on the surface of the dielectric region. The amorphous portion 304A of the doped semiconductor layer 304 may be removed in the subsequent etch process in block 430.

The first deposition may be performed at a low temperature less than about 450° C. and at a pressure of between 5 Torr and 600 Torr.

Figure 5B:
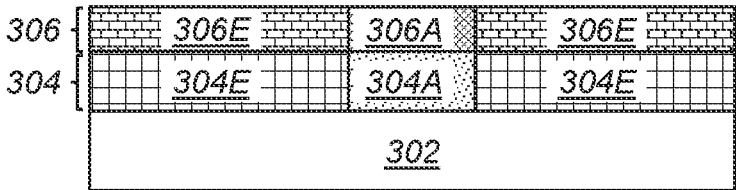

In block 420, subsequent to the first deposition process, a second deposition process is performed to form a cap layer 306 on the doped semiconductor layer 304, as shown in FIG. 5B. The cap layer 306 may be formed of un-doped carbon (C), carbon-doped silicon (Si:C), or carbon-doped silicon germanium (SiGe:C). The cap layer 306 may not be doped with carrier dopants. The second deposition process may include any suitable deposition technique, such as epitaxial (Epi) deposition, chemical vapor deposition (CVD), atomic layer deposition (ALD), or physical vapor deposition (PVD), by flowing a deposition gas in the processing chamber.

In some embodiments, the deposition gas used in the second deposition process includes a silicon-containing precursor, a germanium containing precursor, and a carbon source. The silicon-containing precursor may include silane (SiH$_4$), disilane (Si$_2$H$_6$), tetrasilane (Si$_4$H$_{10}$), or a combination thereof. The germanium-containing precursor may include germane (GeH$_4$), germanium tetrachloride (GeCl$_4$), and digermane (Ge$_2$H$_6$). The carbon source may include silyl alkanes such as monosilyl methane, disilyl methane, trisyl methane and tetrasilyl methane, alkylsilanes such as monomethyl silane (MMS) and dim ethylsilane.

In the second deposition process in block 420, the cap layer 306 may include an epitaxial portion 306E and an amorphous portion 306A due to different nucleation rates of the cap layer 306 on a surface of the epitaxial portion 304E of the doped semiconductor layer 304 and a surface of the amorphous portion 304A of the doped semiconductor layer 304. The nucleation may occur at a faster rate on the surface of the epitaxial portion 304E of the doped semiconductor layer 304 than on the surface of the amorphous portion 304A of the doped semiconductor layer 304, and thus an epitaxial portion 306E of the cap layer 306 may be formed selectively on the surface of the epitaxial portion 304E of the doped semiconductor layer 304 while an amorphous portion 306A of the cap layer 306 may be formed on the surface of the amorphous portion 304A of the doped semiconductor layer 304. The amorphous portion 306A of the cap layer 306 may be removed in the subsequent etch process in block 430.

The second deposition may be performed at a low temperature less than about 450° C. and at a pressure of between 5 Torr and 600 Torr.

Figure 5C:
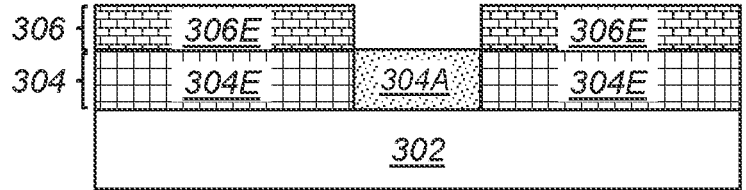
Figure 5D:
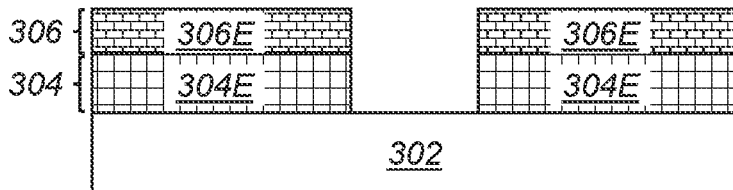

In block 430, an etch process is performed to remove the amorphous portion 306A of the cap layer 306 and the underlying amorphous portion 304A of the doped semiconductor layer 304, as shown in FIGS. 5C and 5D. The etch process in block 430 may be performed, by flowing an etching gas in the processing chamber, subsequently to the second deposition process in block 420, or simultaneously with the first deposition process in block 410 and the second deposition process in block 420.

In the etch process, the amorphous portion 306A of the cap layer 306 can be etched at a faster rate than the epitaxial portion 306E of the cap layer 306, by an appropriate etching gas, and the epitaxial portion 306E of the cap layer 306 is left un-etched, as shown in FIG. 5C. The cap layer 306 is un-doped with carrier dopants, and thus etch selectivity between the amorphous portion 306A and the epitaxial portion 306E is greater than between an amorphous portion and an epitaxial portion of a doped cap layer including silicon and carbon. The underlying amorphous portion 304A of the doped semiconductor layer 304 can be further etched by using the epitaxial portion 306E of the cap layer 306 as a mask, and the epitaxial portion 304E of the doped semiconductor layer 304 is left un-etched, as shown in FIG. 5D. Thus, an overall result of the epitaxial deposition process and the etch process combined can be growth of the epitaxial portion 304E of the doped semiconductor layer 304 (also referred to as the "doped semiconductor epitaxial layer") and the epitaxial portion 306E of the cap layer 306 (also referred to as the "cap epitaxial layer") on the substrate 302.

The etching gas used in the etch process in block 430 includes an etchant gas and a carrier gas. The etchant gas may include halogen-containing gas, such as hydrogen chloride (HCl), chlorine (Cl$_2$), or hydrogen fluoride (HF). The carrier gas may include nitrogen (N$_2$), argon (Ar), helium (He), or hydrogen (H$_2$).

Figure 5E:
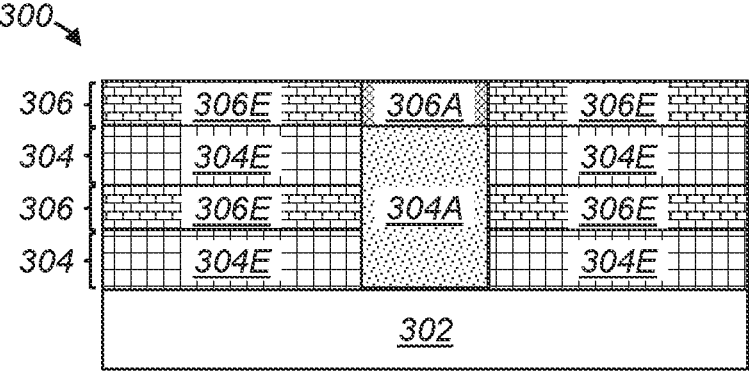
Figure 5F:
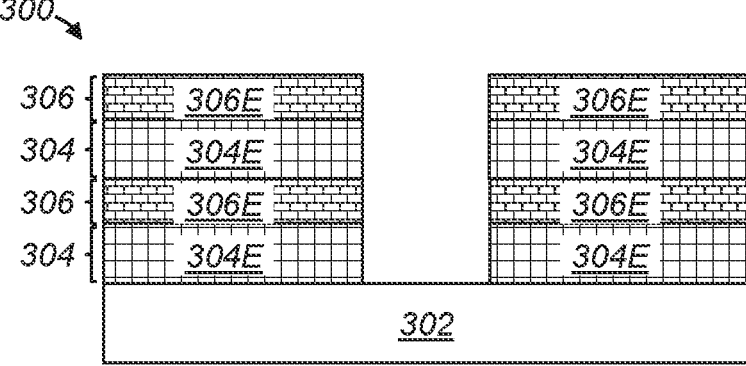

A cycle of the first deposition process in block 410, the second deposition process in block 420, and etch processes in block 430 may be repeated, as shown in FIGS. 5E and 5F, as needed to obtain a desired combined thickness of the doped semiconductor epitaxial layers 304E and the cap epitaxial layers 306E of between about 500 Å and about 700 Å, for example, about 600 Å. The cycle may be repeated, for example, about 30 times.

The embodiments described herein provide methods and system for forming a contact epitaxial layer within a trench on a selected portion of a transistor structure and a cap layer over the contact epitaxial layer to protect the contact epitaxial layer from oxidation and contamination. The contact trench structure includes a metal contact plug formed within a trench between adjacent device modules, and contacts that interface between the contact plug and silicon-based channels in the device modules. The contacts are formed by a selective deposition, reducing parasitic resistance. The metal contact plug is formed void-free by a deposition-etch-deposition process, reducing contact resistance. The contact epitaxial layer may be p-type silicon germanium formed on an exposed surface of a p-type MOS device (e.g., silicon germanium) while no epitaxial layer may be formed on an n-type MOS (e.g., silicon) or a dielectric layer formed over the p-type MOS device and the n-type MOS device. Due to the cap layer, damages on a fabricated contact epitaxial layer are reduced.

The embodiments described herein provide methods and systems for forming a doped semiconductor epitaxial layer in which diffusion of dopants are prevented by an adjacent cap epitaxial layer. The doped semiconductor epitaxial layer includes silicon and carrier dopants high concentration. The cap epitaxial layer includes silicon and carbon and not doped with carrier dopants. The methods include cyclic deposition and etch process, which allows selective epitaxial growth of the doped semiconductor layers and the cap layers.

Multiple pairs of the doped semiconductor epitaxial layer and the cap epitaxial layers that are interposed within the doped semiconductor epitaxial layers are formed and can be used as source/drain in a NMOS device. Due to the prevention of diffusion of dopants, a sharper doping profile can be achieved. Further, due to tensile strain induced in the cap epitaxial layer, an electron mobility can be enhanced, thus leading to high conductivity in its device application.

While the foregoing is directed to embodiments of the present disclosure, other and further embodiments of the disclosure may be devised without departing from the basic scope thereof, and the scope thereof is determined by the claims that follow.

The invention claimed is:

1. A method of forming a doped semiconductor layer in a semiconductor structure, comprising:

performing a plurality of cycles of a first deposition process, a second deposition process subsequent to the first deposition process, and an etch process, the first deposition process forming a doped semiconductor layer on an exposed surface of a substrate, the substrate comprising a semiconductor region and a dielectric region, wherein an epitaxial portion of the doped semiconductor layer is selectively formed on a surface of the semiconductor region, and an amorphous portion of the doped semiconductor layer is selectively formed on a surface of the dielectric region;

the second deposition process forming a cap layer on the doped semiconductor layer, wherein an epitaxial portion of the cap layer is selectively formed on a surface of the epitaxial portion of the doped semiconductor layer, and an amorphous portion of the cap layer is selectively formed on a surface of the amorphous portion of the doped semiconductor layer; and the etch process selectively removing the amorphous portion of the cap layer and the amorphous portion of the doped semiconductor layer, and leaving the epitaxial portion of the cap layer and the epitaxial portion of the doped semiconductor layer, wherein the doped semiconductor layer comprises silicon having carrier dopants, and the cap layer comprises carbon not doped with carrier dopants.

2. The method of claim 1, wherein the carrier dopants comprise phosphorus.

3. The method of claim 1, wherein the doped semiconductor layer has a thickness of between 15 Å and 20 Å, and the cap layer has a thickness of between 5 Å and 15 Å.

4. The method of claim 1, wherein the first deposition process comprises flowing a silicon-containing precursor and a dopant source in a processing chamber.

5. The method of claim 4, wherein the second deposition process comprises flowing a silicon-containing precursor and a carbon source in the processing chamber.

6. The method of claim 5, wherein the etch process comprises flowing an etchant gas and a carrier gas in a processing gas, subsequent to the second deposition process.

7. The method of claim 5, the etch process comprises flowing an etchant gas and a carrier gas in a processing gas, simultaneously with the first deposition process and the second deposition process.

8. The method of claim 5, wherein the first deposition process and the second deposition process are performed at a low temperature less than about 450° C. and at a pressure of between 5 Torr and 600 Torr.

9. A processing system, comprising:

a processing chamber; and a system controller configured to cause the processing system to:

perform a plurality of cycles of a first deposition process, a second deposition process subsequent to the first deposition process, and an etch process, the first deposition process forming a doped semiconductor layer on an exposed surface of a substrate, the substrate comprising a semiconductor region and a dielectric region, wherein an epitaxial portion of the doped semiconductor layer is selectively formed on a surface of the semiconductor region, and an amorphous portion of the doped semiconductor layer is selectively formed on a surface of the dielectric region;

the second deposition process forming a cap layer on the doped semiconductor layer, wherein an epitaxial portion of the cap layer is selectively formed on a surface of the epitaxial portion of the doped semiconductor layer, and an amorphous portion of the cap layer is selectively formed on a surface of the amorphous portion of the doped semiconductor layer; and the etch process selectively removing the amorphous portion of the cap layer and the amorphous portion of the doped semiconductor layer, and leaving the epitaxial portion of the cap layer and the epitaxial portion of the doped semiconductor layer, wherein the doped semiconductor layer comprises silicon having carrier dopants, and the cap layer comprises carbon not doped with carrier dopants.

10. The processing system of claim 9, wherein the carrier dopants comprise phosphorus.

11. The processing system of claim 9, wherein the doped semiconductor layer has a thickness of between 15 Å and 20 Å, and the un-doped cap layer has a thickness of between 5 Å and 15 Å.

12. The processing system of claim 9, wherein the first deposition process comprises flowing a silicon-containing precursor and a dopant source in the processing chamber.

13. The processing system of claim 12, wherein the second deposition process comprises flowing a silicon-containing precursor and a carbon source in the processing chamber.

14. The processing system of claim 13, wherein the etch process comprises flowing an etchant gas and a carrier gas in a processing gas, subsequent to the second deposition process.

15. The processing system of claim 13, the etch process comprises flowing an etchant gas and a carrier gas in a processing gas, simultaneously with the first deposition process and the second deposition process.

16. The processing system of claim 15, wherein the first deposition process and the second deposition process are performed at a low temperature less than about 450° C. and at a pressure of between 5 Torr and 600 Torr.

\* \* \* \* \*